(12) United States Patent
Fung

(10) Patent No.: US 10,141,430 B1
(45) Date of Patent: Nov. 27, 2018

(54) FIN STRUCTURES WITH UNIFORM THRESHOLD VOLTAGE DISTRIBUTION AND METHOD OF MAKING THE SAME

(71) Applicant: Taiwan Semiconductor Manufacturing Co., Ltd., Hsinchu (TW)

(72) Inventor: Ka-Hing Fung, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/661,037

(22) Filed: Jul. 27, 2017

(51) Int. Cl.
*H01L 21/8234* (2006.01)
*H01L 29/66* (2006.01)
*H01L 29/10* (2006.01)
*H01L 21/66* (2006.01)
*H01L 21/02* (2006.01)
*H01L 29/78* (2006.01)

(52) U.S. Cl.
CPC .. *H01L 29/66795* (2013.01); *H01L 21/02532* (2013.01); *H01L 21/823431* (2013.01); *H01L 22/20* (2013.01); *H01L 29/1054* (2013.01); *H01L 29/785* (2013.01); *H01L 29/7853* (2013.01); *H01L 29/105* (2013.01)

(58) Field of Classification Search
CPC ....... H01L 21/02532; H01L 21/823431; H01L 22/20; H01L 29/66795; H01L 29/66803; H01L 29/785; H01L 29/7851; H01L 29/7853
See application file for complete search history.

(56) References Cited

U.S. PATENT DOCUMENTS

| | | | |
|---|---|---|---|
| 6,720,587 B2 * | 4/2004 | Nozawa | H01L 22/20 257/184 |
| 8,796,666 B1 | 8/2014 | Huang et al. | |
| 8,815,712 B2 | 8/2014 | Wan et al. | |
| 8,901,664 B2 | 12/2014 | Basker et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,496,186 B1 * | 11/2016 | Bedell | H01L 21/845 |
| 9,520,482 B1 | 12/2016 | Chang et al. | |

(Continued)

FOREIGN PATENT DOCUMENTS

EP 2978016 1/2016

*Primary Examiner* — Stephen W Smoot
(74) *Attorney, Agent, or Firm* — Haynes and Boone, LLP

(57) ABSTRACT

The present disclosure provides a method of forming a semiconductor device structure. The method includes determining a threshold voltage distribution profile along a height of a silicon germanium (SiGe) fin structure over a semiconductor substrate; determining a germanium (Ge) concentration profile to counteract the threshold voltage distribution profile according to a correlation between Ge concentration and threshold voltage in the SiGe fin structure; forming a SiGe epitaxial layer with the Ge concentration profile along a thickness of the SiGe epitaxial layer; etching the SiGe epitaxial layer to form the SiGe fin structure; and forming, on the SiGe fin structure, a field-effect transistor having a uniform threshold voltage along the height of the SiGe fin structure.

20 Claims, 10 Drawing Sheets

(56) References Cited

U.S. PATENT DOCUMENTS

| | | |
|---|---|---|
| 9,548,303 B2 | 1/2017 | Lee et al. |
| 9,576,814 B2 | 2/2017 | Wu et al. |
| 2010/0148217 A1* | 6/2010 | Simonelli ......... H01L 21/02381 257/192 |
| 2013/0285116 A1 | 10/2013 | Lochtefeld et al. |
| 2015/0137268 A1* | 5/2015 | Fung .................... H01L 29/785 257/402 |
| 2015/0228648 A1 | 8/2015 | Chi et al. |
| 2015/0311109 A1* | 10/2015 | Doris ................. H01L 21/7624 257/347 |
| 2016/0111539 A1 | 4/2016 | Nayak |
| 2016/0211375 A1* | 7/2016 | Chi .................... H01L 27/0886 |
| 2017/0288056 A1* | 10/2017 | Balakrishnan ...... H01L 29/7827 |

* cited by examiner

FIN STRUCTURES WITH UNIFORM THRESHOLD VOLTAGE DISTRIBUTION AND METHOD OF MAKING THE SAME

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping around) the fin. Having a gate on multiple sides of the channel reduces short channel effect and allows for higher current flow.

Designing a FinFET is not without its own challenges. For example, while it is desirable to have a low threshold voltage to increase the on-state current (Ion), having a low threshold voltage can lead to high leakage current, including off-state current (Ioff). Consequently, one of the objectives in designing a FinFET is to achieve a threshold voltage that results in a good Ion/Ioff ratio. The threshold voltage in a FinFET is not constant throughout the height of the fin. It is affected by several factors introduced by the design itself or the fabrication processes. For example, the gate of the FinFET is in contact with three surfaces at the top of the fin while only in contact with two surfaces for the rest of the fin. In addition, the fin may not have uniform shape and width along its height. Furthermore, the distribution of anti-punch through dopants and the source/drain features also affect the threshold voltage. As a result, a non-uniform threshold voltage distribution is usually observed. Often portions of the fin with lower-than-expected threshold voltages suffer from high off-state current density while portions of the fin with higher-than-expected threshold voltage suffer from low on-state current density.

Therefore, although existing FinFET devices have been generally adequate for their intended purposes, they have not been satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DESCRIPTION

Figure 1:
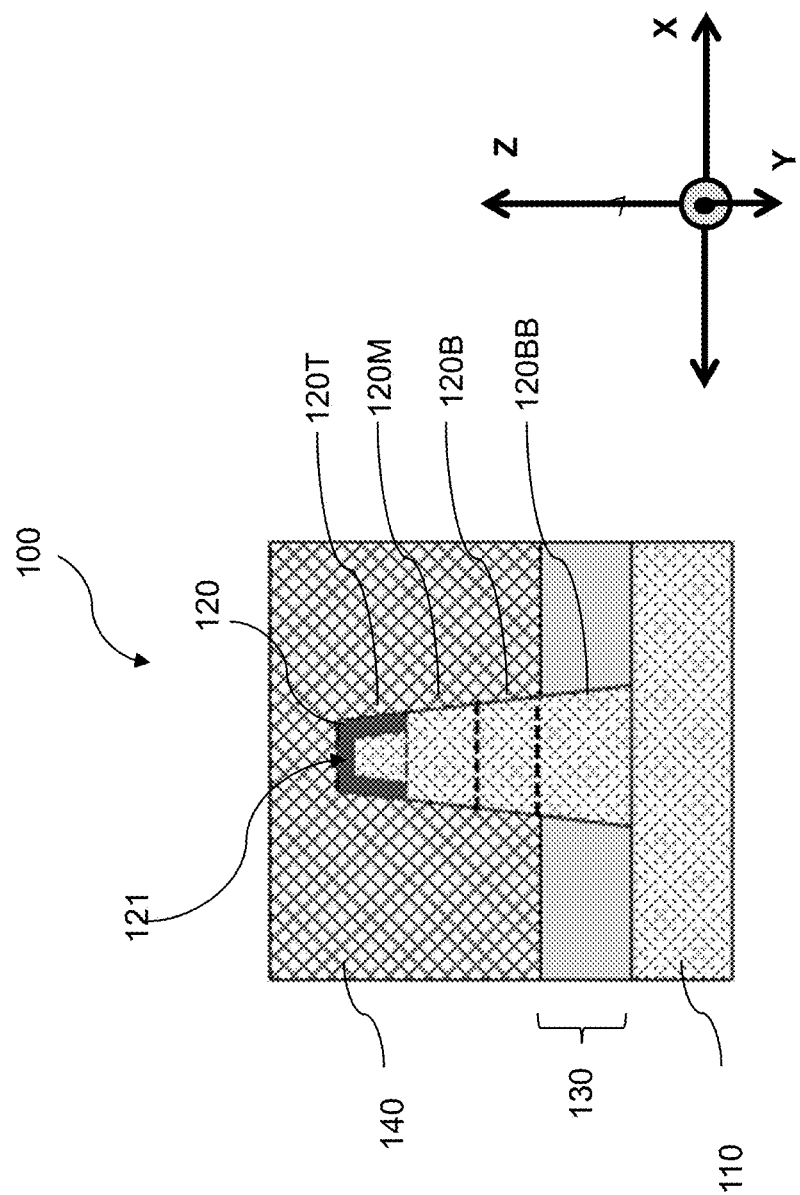
FIG. 1 is a cross-sectional view of a FinFET device according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

Referring to FIG. 1, illustrated therein is a cross-sectional view of a FinFET device 100 according to aspects of the present disclosure. In some embodiments, the FinFET device 100 includes a thin silicon-containing "fin-like" structure 120 (hereinafter referred to as the fin 120) formed over a semiconductor substrate 110. The semiconductor substrate 110 usually includes silicon. Alternatively, the semiconductor substrate 110 may include epitaxial layers of germanium, silicon germanium, or other semiconductor materials and combinations. In some instances, depending on the design the FinFET device 100, the semiconductor substrate 110 may be doped with p-type dopants such as boron (B), aluminum (Al) and gallium (Ga) or n-type dopants such as antimony (Sb), arsenic (As) and phosphorous (P).

In some embodiments, a fin structure such as the fin 120 is formed of epitaxial layers on the substrate 110 and the epitaxial layers are formed of silicon (Si) alone or together with a semiconductor material that is compatible with silicon. Such a semiconductor material includes germanium (Ge) and carbon (C). Introduction of Ge or C into Si lattice is known to strain the Si lattice and is usually utilized to improve the device performance in certain aspects. In some embodiments, the epitaxial layers are formed of epitaxial growth of Si and Ge using techniques such as epitaxial deposition by chemical vapor deposition (CVD) or low-pressure chemical vapor deposition (LPCVD). By controlling the delivery of gas reactants and other process parameters during the CVD epitaxial deposition, the concentrations of Si and Ge along the height of the epitaxial layers can be modulated. In embodiments where the fin 120 is formed of epitaxially grown SiGe epitaxial layers, the epitaxial SiGe layers are first formed over the semiconductor substrate 110 and then the epitaxial SiGe layers are patterned as described below.

In some embodiments, the fin 120 is formed from the epitaxial SiGe layers by photolithography patterning and etching. For example, a patterned photoresist layer is formed on the epitaxial SiGe layers by a photolithography technique, and then an etching process, such as anisotropic etching, is applied to the epitaxial SiGe layers to form one or more fin 120. In another example, a hard mask is used. In that case, the hard mask is formed by depositing a hard mask material on the epitaxial SiGe layer. A photoresist layer is then deposited on the hard mask. After patterned using photolithography, the photoresist on the hard mask then serves as the etch mask when the hard mask is etched and patterned. Thereafter, an etching process, such as anisotropic etching, is applied to the epitaxial SiGe layers to form one or more fin 120 using the hard mask as an etch mask. To isolate the fin 120 from an adjacent fin, a dielectric material (such as thermally grown silicon oxide and CVD deposited silicon oxide) is formed to fill trenches between the fin 120 and its neighboring fins. The dielectric layer is then polished by chemical mechanical polishing (CMP) and then etched back to expose a portion of the fin 120 while a portion of the fin 120 remains covered by the etched back dielectric layer, usually referred to as shallow trench isolation (STI). The STI 130 is shown in FIG. 1. The FinFET fabrication process then continues to forming a gate stack 140 over a portion of the fin 120. Because the gate stack 140 covers the top surface and two sidewalls of the exposed fin 120, a gate such as the gate stack 140 is usually referred to as a trigate. The gate stack 140 includes a gate dielectric layer and a gate electrode on the gate dielectric layer, each having one or multiple films. In some embodiments, the gate stack 140 at least includes a gate dielectric layer (not shown) interfacing the fin 120 and a metal layer (not shown) over the gate dielectric layer. The gate dielectric layer can be formed of high-K dielectrics such as hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$), lead lanthanum titanate, strontium bismuth tantalate, bismuth titanate and barium zirconium titanate. In some instances, the gate stack 140 may include one or more work function metal layers formed of, for example, TiN, TaN, TaCN, TiCN, TiC, Mo, and W. In some embodiments, the source and drain regions of the FinFET device 100 (not shown) are doped by ion implantation, followed by thermal treatment, such as annealing.

The threshold voltage along the height of the fin 120 is not uniform due to several factors. For example, the trigate has stronger effect over the top portion 120T than the rest of the fin 120. For illustration purposes, the effect of the trigate is only prominent in the marked region 121, but not as prominent further downwards in a middle portion 120M of the fin 120. With respect to state-of-the-art FinFET devices, the height of the top portion 120T is approximately the width of the top surface of the fin 120. The trigate is known to suppress short channel effect. Therefore, the top portion 120T usually maintains a threshold voltage higher than that of the middle portion 120M. A bottom portion 120B of the fin 120 is affected by the width of the fin 120 along the X direction. As described above, the fin 120 is formed by, inter alia, an anisotropic etching step. Such an anisotropic etching step has its limitations and usually results in rounded edge and wider bottom portion 120B. This result is illustrated in FIG. 1 as well. The bottom portion 120B is featured by a larger width along the X direction. Due to added distance from the gate stack 140, the bottom portion 120B usually has a threshold voltage higher than that of the middle portion 120M. However, as the trigate effect is often more dominant, oftentimes the threshold voltage of the top portion 120T is higher than that of the bottom portion 120B. Other factors, such as strain in the STI around the source/drain features, Ge concentration in the source and drain features, and dopant levels in the source and drain features, also play important roles in threshold distribution along the height of the fin.

The portion of the fin 120 below the bottom portion 120B and covered by the STI 130 is referred to as a base portion 120BB. In some embodiments, an anti-punch through (APT) or punch through stop (PTS) doping layer is implemented in the base portion 120BB below the bottom portion 120B by in situ doping during the epitaxial growth of the SiGe layer to reduce the punch through effect brought about by parasitic current. For an n-type FinFET device, a p-type APT dopant, such as boron, is usually used. For a p-type FinFET device, an n-type APT dopant, such as phosphorus, is commonly used.

Figure 2:
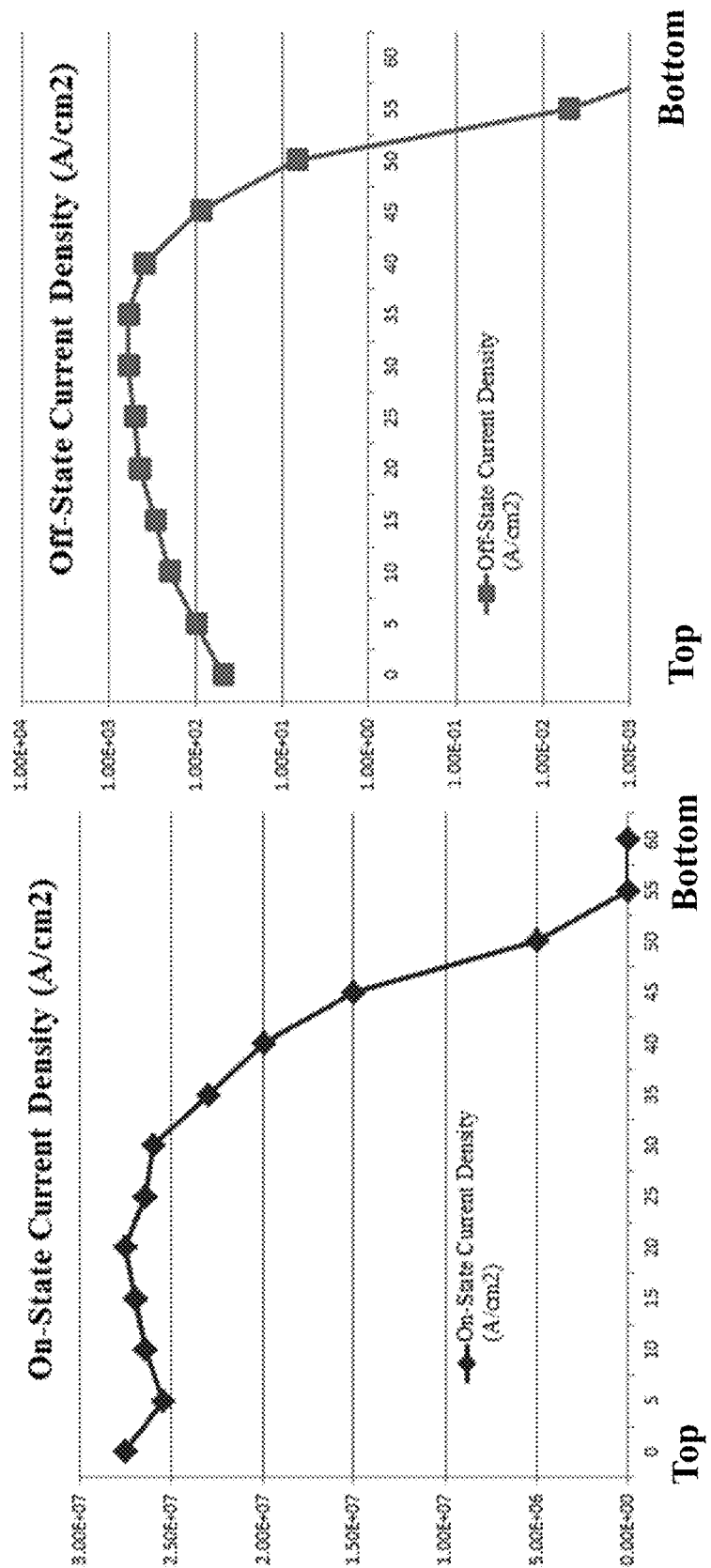
FIG. 2 includes on-state and off-state current densities along a height of a FinFET device, according to aspects of the present disclosure.

In some instances, the non-uniform threshold voltage distribution described above would result in uneven distributions of on-state current density (Ion density) and off-state current density (Ioff density) shown in FIG. 2, where the X-axis denotes the height of the fin from the top of the fin (X=0) to the base (X=60 nm in this example). As shown in FIG. 2, a FinFET device similar to the FinFET 100 tend to have low Ion and Ioff densities in the top portion 120T, higher Ion and Ioff densities in the middle portion 120M, much lower Ion and Ioff densities in the bottom portion 120B, and zero or negligible Ion and Ioff density in the base portion 120BB.

FIG. 2 also shows different how Ion and Ioff density curves can be affected by dopants that diffuse into the fin 120 from the base portion 120BB. APT dopants, such as boron and phosphorous, are prone to thermal diffusion upward into the fin 120. This thermal diffusion will be illustrated in FIG. 3 below. Presence of APT dopant in the bottom portion 120B raises the threshold voltage there and reduces Ion densities, sometimes by an order of magnitude. The significant drop in Ion density in effect renders the bottom portion 120B useless in terms of on-state current density.

Figure 3:
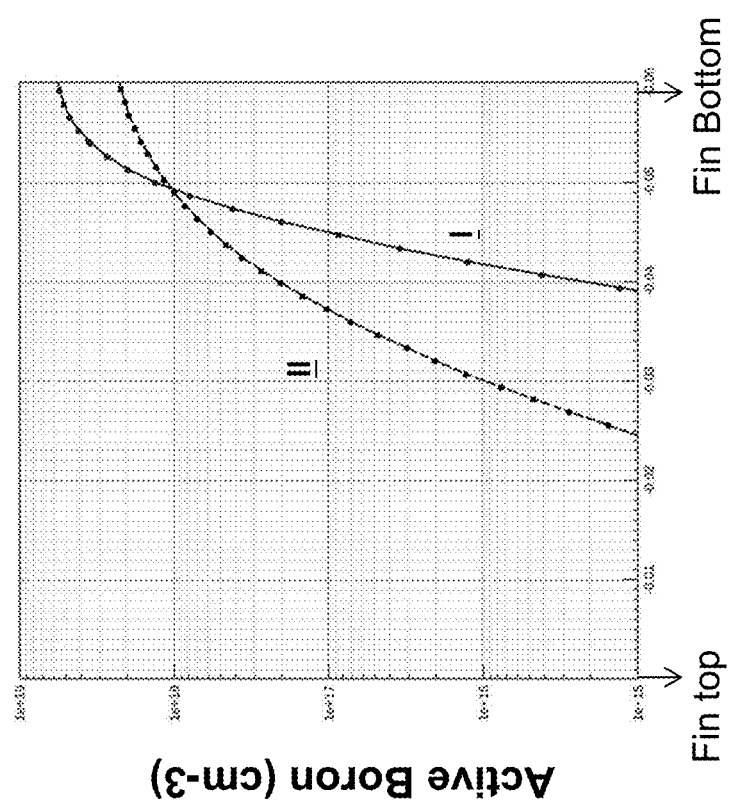
FIG. 3 is a diagram illustrating the shifting of dopant concentration along a height of a FinFET device due to thermal treatments, according to aspects of the present disclosure.

Referring now to FIG. 3, shown therein are upward thermal diffusion of a p-type APT dopant-boron during high thermal growth of silicon oxide STI or annealing of the source/drain features. As described above, in some embodiments, silicon oxide is thermally grown after the fin 120 is formed and the APT dopant is in place. Depending on the temperature and duration of the thermal treatment, the p-type APT dopant-boron can have different diffusion profiles. FIG. 3 shows two diffusion profiles I and II. Profile I represents a boron APT dopant diffusion profile with a lower temperature or a shorter thermal treatment duration. Profile II represents a boron APT dopant diffusion profile with a higher temperature or a longer thermal treatment duration. As the APT dopant is subjected to more thermal treatment in terms of temperature and time, the more the diffusion profile advances upward into the bottom portion 120B, reducing usability of the bottom portion 120B. It is noted that while FIG. 3 only illustrates the thermal diffusion of a p-type APT dopant, an n-type APT dopant, such as phosphorous, shares similar thermal diffusion characteristics. The shape of the APT dopant concentration profile depends largely on the diffusivity of the APT dopant.

Conventionally, in situ doping with dopants during epitaxial growth of the SiGe layer has been disclosed. While in situ doping may improve the uniformity of threshold voltage along the height of the SiGe fin, it has drawbacks. One of the drawbacks is the diffusion of the dopants during thermal treatment that happens after the in situ doping. The thermal diffusion of dopants prevents the preferred abrupt concentration gradient and generates an undesirable diffusion profile that results in high threshold voltage in the bottom portion of the fin. Another drawback is the lattice defects caused by in situ doping.

Through experiments, mathematical modeling, measurements and computer simulations, it is found that complete replacement of Si for Ge in a fin would result in a 400 mV lowering of threshold voltage. This approximately translates into 4 mV threshold voltage lowering per 1% increase in Ge concentration. In embodiments of the present disclosure, the Ge concentration in the SiGe fin is utilized to counter the relatively high threshold voltages in different portions of the SiGe fin. As compared to dopants, epitaxially grown Ge creates little lattice defects in the SiGe fin and Ge does not diffuse along the length of a SiGe fin, such as the fin 120. Therefore, once a Ge concentration profile is implemented during epitaxial growth of the SiGe fin, the Ge concentration profile does not shift during any later thermal treatments.

Figure 4:
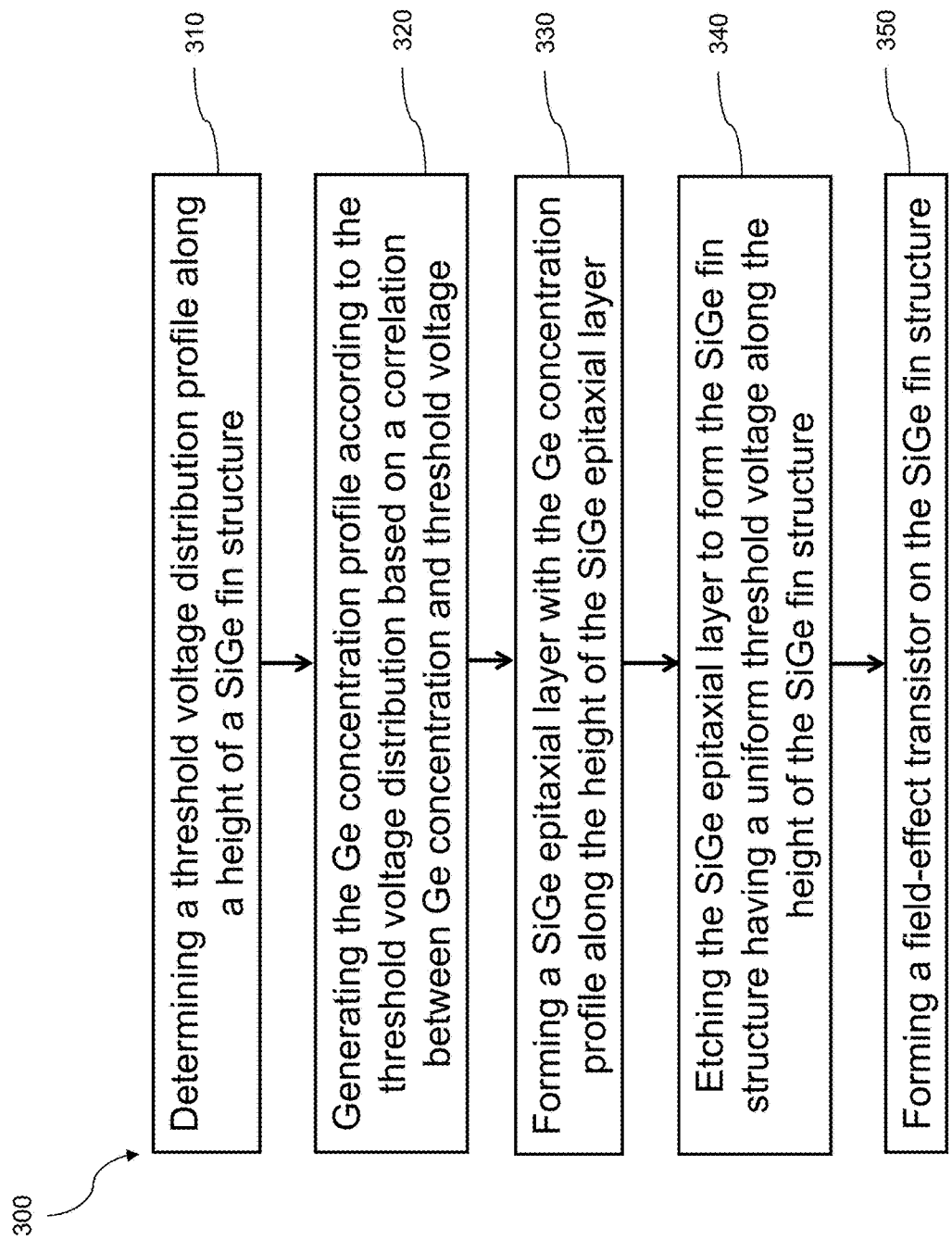
FIG. 4 is a flowchart illustrating a method of determining a germanium concentration profile in a SiGe fin structure, according to aspects of the present disclosure.

FIG. 4 is a flowchart illustrating a method 300 of determining a germanium concentration profile in a SiGe fin structure, according to aspects of the present disclosure. The method 300 includes a step 310 of: determining a threshold voltage distribution profile along a height of a SiGe fin structure; a step 320 of: generating the Ge concentration profile according to the threshold voltage distribution based on a correlation between Ge concentration and threshold voltage; a step 330 of: forming a SiGe epitaxial layer with the Ge concentration profile along the height of the SiGe fin structure; a step 340 of: etching the SiGe epitaxial layer to form the SiGe fin structure having a uniform threshold voltage along the height of the SiGe fin structure; and a step 350 of forming a field-effect transistor on the SiGe fin structure. For simplicity, steps 310 to 350 are described in relation to the fin 120 in FIG. 1. As described above, several factors may affect the threshold voltage distribution, rendering it non-uniform. In order to effectively address uneven threshold voltage in the fin 120, the threshold voltage distribution before implementation of any Ge concentration profile has to be determined first in step 310. Then, in step 320, a Ge concentration profile is generated to counteract the unevenness in the threshold voltage distribution along the height of the fin 120. The Ge concentration profile is generated based on a correlation between the Ge concentration and the threshold voltage. In some embodiments, the correlation is 4 mV threshold voltage lowering per 1% increase in Ge concentration. In some embodiments, the correlation is that the threshold voltage would decrease with the increase in Ge concentration in general. Because the Ge concentration profile is intended to counteract the foregoing threshold-voltage-impacting factors to generate a uniform threshold voltage distribution in the resulted SiGe in structure, the Ge concentration profile is not a uniform profile. In addition, in some embodiments, the difference between the highest of Ge concentration and the lowest concentration in the Ge concentration profile falls within a range between 5% and 15%, which translate into threshold voltage adjustment range between 20 mv and 60 mv. It is noted that the Ge concentration profile, like the threshold voltage distribution, is continuous throughout the height of the fin 120. Therefore, any general reference to the threshold voltage in any of the top portion 120T, the middle portion 120M, the bottom portion 120B, and the base portion 120BB is and should be considered an average threshold voltage for that portion, not a fixed threshold voltage value with respect to that portion.

The method 300 then passes to step 330. At step 330, Ge is supplied and process parameters are selected according to the Ge concentration profile generated in step 320 during formation of a SiGe epitaxial layer such that the SiGe epitaxial layer includes the Ge concentration profile along the thickness of the SiGe epitaxial layer. In some embodiments, Ge is supplied in the form of a Ge-containing reactant gas, such as germanium tetrahydride ($GeH_4$) and germanium hydride ($Ge_2H_6$) in a chemical vapor deposition (CVD) or low pressure CVD (LPCVD) epitaxial growth process. Then at step 340, the SiGe epitaxial layer with the Ge concentration profile is etched to form SiGe fin structures along the height of the SiGe fin structure. The method 300 then proceeds to step 350, where further processes are carried out to form a field-effect transistor (FET) on the SiGe fin structure. Such further processes may include forming a gate stack on a segment of the SiGe fin and forming source and drain features of the FET.

Several factors may contribute to non-uniformity of threshold voltage in different portions of the fin 120 and can be used in mathematical models to determine the threshold voltage distribution along the height of the fin 120. Such factors include effect of a trigate, the fin width distribution along the height of the fin 120, proximity of the fin 120 to source/drain features, level of dopants in the source/drain features, and a concentration profile of a dopant along the height of the fin 120. In some instances, a mathematical model, such as a multi-variable function, is used in step 310 to predict and determine the threshold voltage distribution in the fin 120.

Figure 5:
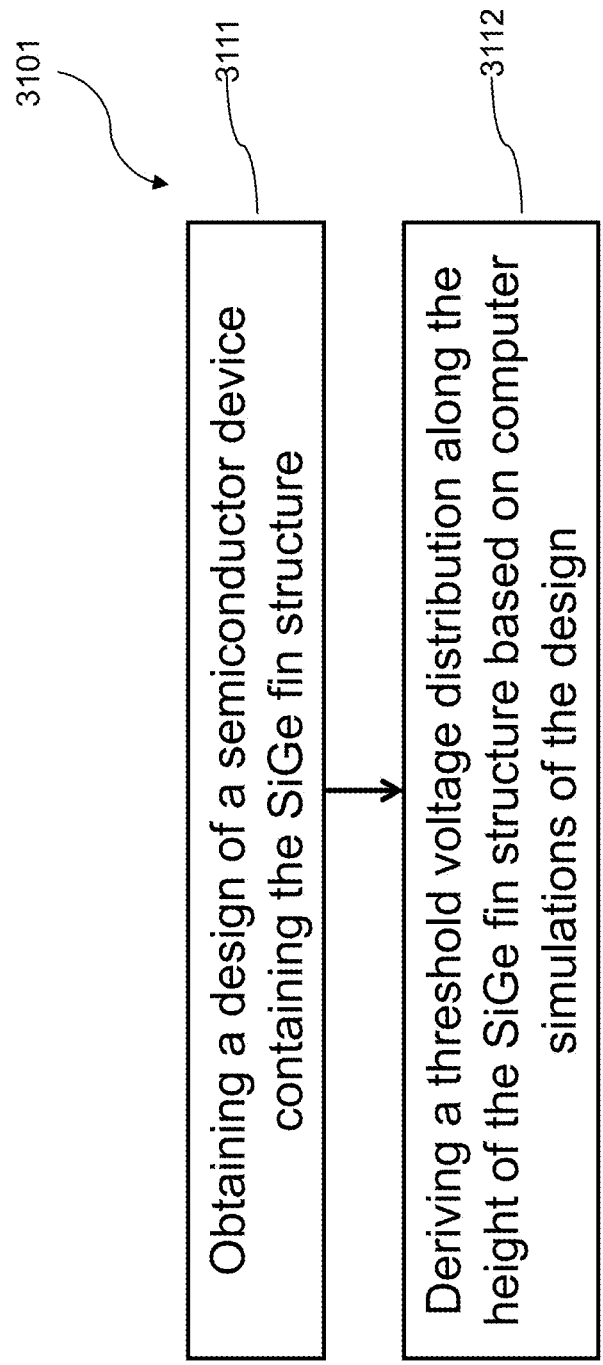
FIG. 5 is a flowchart illustrating a method of determining a threshold voltage distribution profile along a height of a silicon germanium fin structure, according to aspects of the present disclosure.
Figure 6:
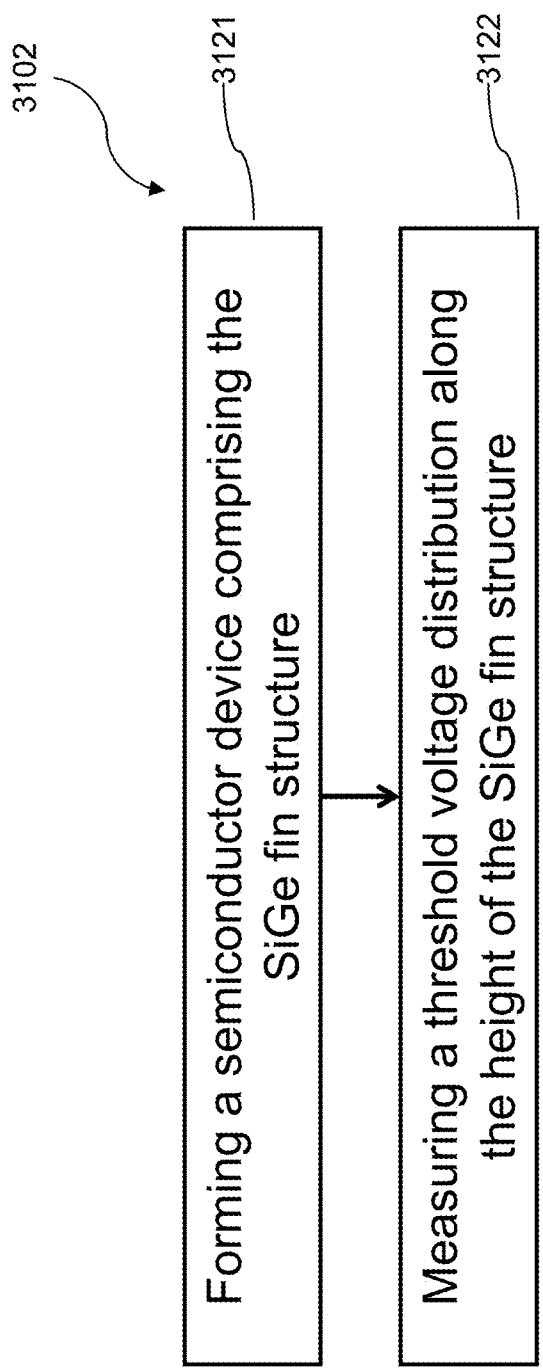
FIG. 6 is a flowchart illustrating another method of determining a threshold voltage distribution profile along a height of a silicon germanium fin structure, according to aspects of the present disclosure.
Figure 7:
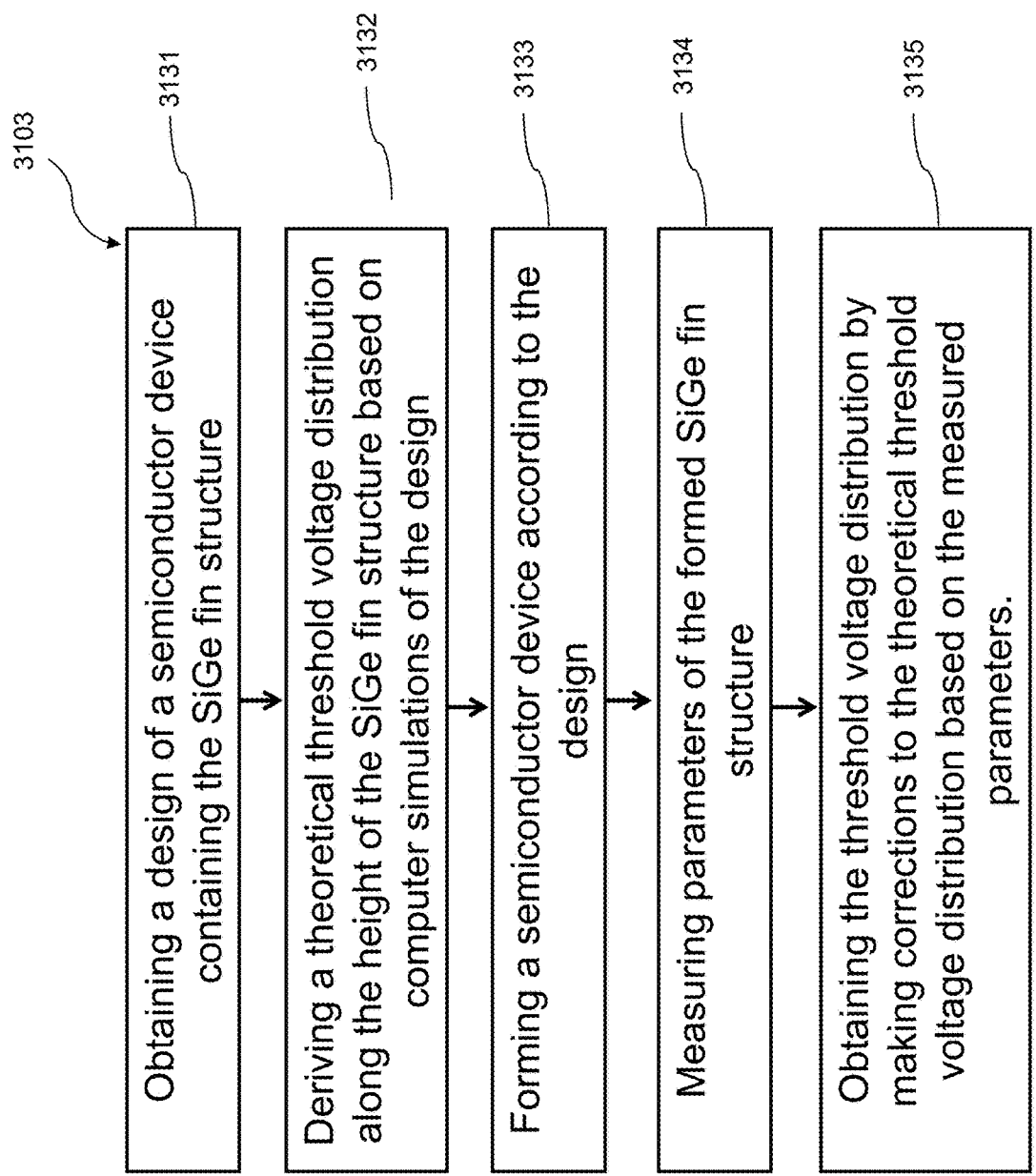
FIG. 7 is a flowchart illustrating yet another method of determining a threshold voltage distribution profile along a height of a silicon germanium fin structure, according to aspects of the present disclosure.

FIGS. 5, 6, and 7 illustrate methods to carry out step 310, according to aspects of the present disclosure. The method 3101 illustrated in FIG. 5 relies on computer simulations of a design of the semiconductor device containing the fin 120. The method 3102 illustrated in FIG. 6 relies on direct or indirect measurements of the threshold voltage distribution. Finally, the method 3103, as illustrated in FIG. 7, combines computer simulations with real world measurements of parameters of the semiconductor device containing the fin 120.

Referring to FIG. 5, shown therein is a flowchart illustrating the method 3101 of determining a threshold voltage distribution profile along a height of a silicon germanium fin structure, according to aspects of the present disclosure. The method 3101 includes a step 3111 of: obtaining a design of a semiconductor device comprising the SiGe fin structure; and a step 3112 of: deriving a threshold voltage distribution along the height of the SiGe fin structure based on computer simulations of the design. In some embodiments, in step 3112, the computer simulations are carried out using computer simulation programs, such as HSPICE, based on a design of a semiconductor device obtained in step 3111. These simulation programs can be programmed to take into consideration the factors that affect the threshold voltage in different portions of a SiGe fin, such as the fin 120.

Referring now to FIG. 6, which is a flowchart illustrating the method 3102 of determining a threshold voltage distribution profile along a height of a silicon germanium fin structure, according to aspects of the present disclosure. The method 3102 includes a step 3121 of: forming a semiconductor device comprising the SiGe fin structure; and a step 3122 of: measuring a threshold voltage distribution along the height of the SiGe fin structure. In some instances, computer simulations may not produce threshold voltage distribution that tracks the actual threshold voltage distributions in the as-fabricated semiconductor devices. In those instances, the threshold voltage distribution along the height of the SiGe fin structure should be determined using method 3102. The semiconductor device including the SiGe fin structure is fabricated first in step 3121. Then the threshold voltages at several locations along the height of the SiGe fin are directly or indirectly measured in step 3122.

FIG. 7 is a flowchart illustrating the method 3103 of determining a threshold voltage distribution profile along a height of a silicon germanium fin structure, according to aspects of the present disclosure. The method 3103 includes a step 3131 of: obtaining a design of a semiconductor device containing the SiGe fin structure; a step 3132 of: deriving a theoretical threshold voltage distribution along the height of the SiGe fin structure based on computer simulations of the design; a step 3133 of: forming a semiconductor device according to the design; a step 3134 of: measuring parameters of the formed SiGe fin structure; and a step 3135 of: obtaining the threshold voltage distribution by making corrections to the theoretical threshold voltage distribution based on the measured parameters.

Steps 3131 and 3132 are similar to steps 3111 and 3112 in method 3101. At step 3131, a design of a semiconductor device containing the SiGe fin structure is obtained. In some embodiments, the design includes dimensions of various features in the semiconductor device, type of dopants, dopant dosage, and thermal treatment conditions. All of the aforementioned information becomes useful when setting boundary conditions for the computer simulations in step 3132. However, different from step 3112, the threshold voltage distribution from step 3132 is only regarded as a theoretical threshold voltage distribution, which requires further validation and correction at steps 3134 and 3135.

At step 3133, the semiconductor device according to the simulated design is formed. This allows several parameters to be measured at step 3134. The semiconductor device formed in step 3133 can deviate from the semiconductor device as designed. For example, the threshold voltage distribution along the height of the SiGe fin, as measured, can be different from the theoretical threshold voltage distribution. In addition, various feature dimensions and doping concentrations that can affect the threshold voltage distribution can be different from the design dimensions and concentrations. For example, the actual gate dielectric thickness can be different from the design gate dielectric thickness. For another example, the width of the SiGe fin along the X direction can be different from the design fin width. For yet another example, the APT doping concentration as measured can be different from the design APT doping concentration.

Furthermore, sometimes it can be challenging to accurately measure the threshold voltage distribution along the height of the SiGe fin. In that case, readily measurable parameters such as feature dimensions and doping concentration can be measured and replugged into the computer simulation models to obtain threshold voltages distributions more representative of the real-world situations. For example, electron microscope images of the SiGe fin or other portions of the formed semiconductor device can be taken to determine feature dimensions such as layer thickness or fin width. Electron microscope images include scanning electron microscope (SEM) images and transmission electron microscope (TEM) images. In addition, dopant concentrations or dopant concentration profiles can be detected by secondary ion mass spectrometry (SIMS). These readily measurable parameters can be used to correct the models used in computer simulations, to correct the threshold voltage values, or to modify certain boundary conditions at step 3135.

Alternatively, in some implementation, method 3103 can be truncated to include only steps 3133, 3134, and 3135, provided that a design of a semiconductor device is available. In these implementations, the truncated method 3103 starts with step 3133 by forming a semiconductor device according to the available design. Once the semiconductor device is formed, at step 3134, it is subject to various measurements to determine the actual device parameters of the as-formed semiconductor device. The truncated method 3103 then proceeds to step 3135, where the actual as-measured device parameters are plugged into computer simulation models to derive the threshold voltage distribution along the height of the SiGe fin. The computer simulation models used for step 3135 in the truncated method 3103 are the essentially the same models used for step 3132 in method 3103. The difference lies in whether the parameters are derived from the design itself or are measured off of a semiconductor device that is fabricated according to the design. In some instances, the device parameters include dopant levels in source and drain features and the strain the STI exerts on the fin.

Figure 8:
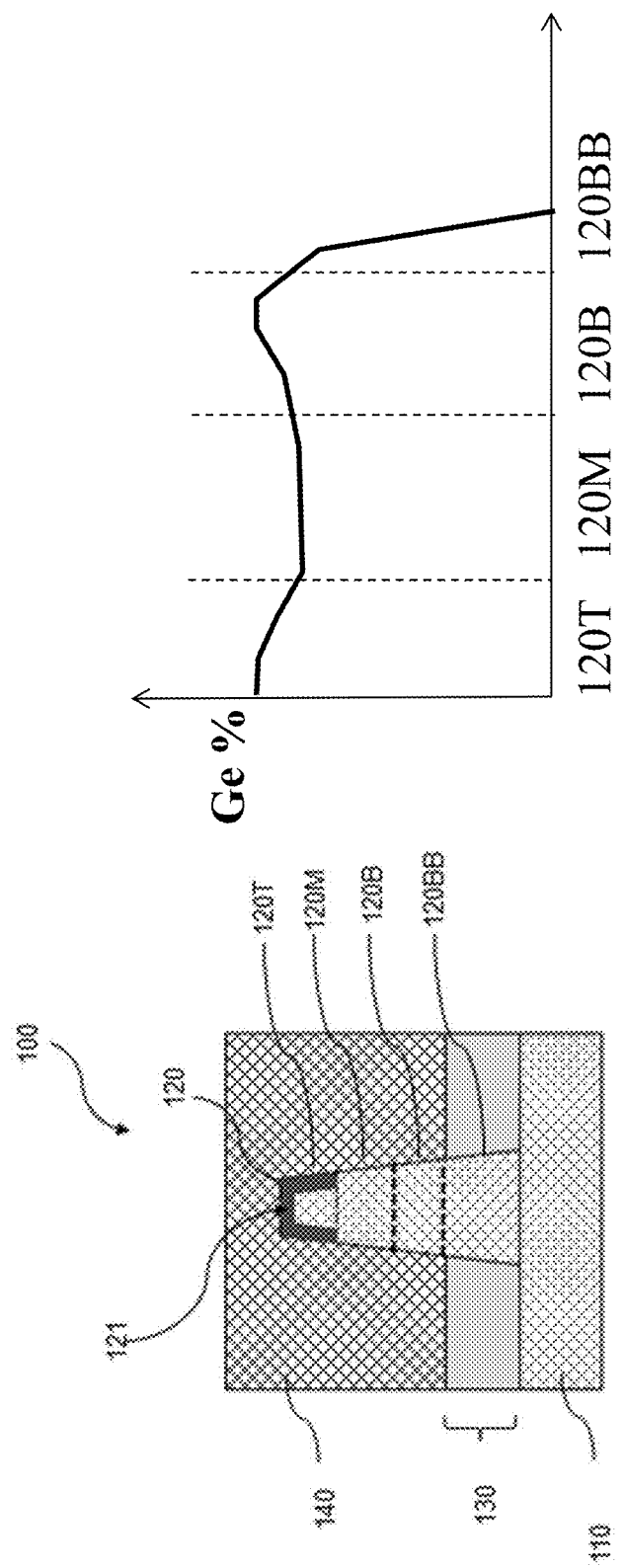
FIG. 8 illustrates a germanium concentration profile along the height of the fin, according to aspects of the present disclosure.

The threshold voltage distribution along the height of a SiGe fin in a semiconductor can take so many different shapes, so do the Ge concentration profiles that are required to counteract the ups and downs of the threshold voltage profile. In a semiconductor device that includes the fin 120 shown in FIG. 1, the threshold voltage profile is usually characterized by higher threshold voltages in the top portion 120T and the bottom portion 120B. The middle portion 120M, due to its distance from the trigate and average fin width, tends to have lower average threshold voltage. This general threshold voltage profile is indirectly shown in FIG. 2, where the on-state and off state current densities in the top and bottom portion 120T and 120B tend to be lower. In some embodiments, a Ge concentration profile along the height of the SiGe fin is shown in FIG. 8. For the ease of reference, FIG. 1 is reproduced on the left-hand side of FIG. 8. As discussed above, the Ge concentration profile on the right-hand side of FIG. 8 features higher average Ge concentrations in the top and bottom portions 120T and 120B and lower average Ge concentration in the middle portion 120M. In some embodiments, the average Ge concentration in the top portion is higher than the average Ge concentration in the bottom portion, which is higher than the average Ge concentration in the middle portion. In some instances, the Ge concentration in the base portion 120BB is zero. In some implementations, the difference between the average Ge concentration in the top portion 120T and the average Ge concentration in the middle portion 120M falls within the range between 5% and 15%.

Figure 9:
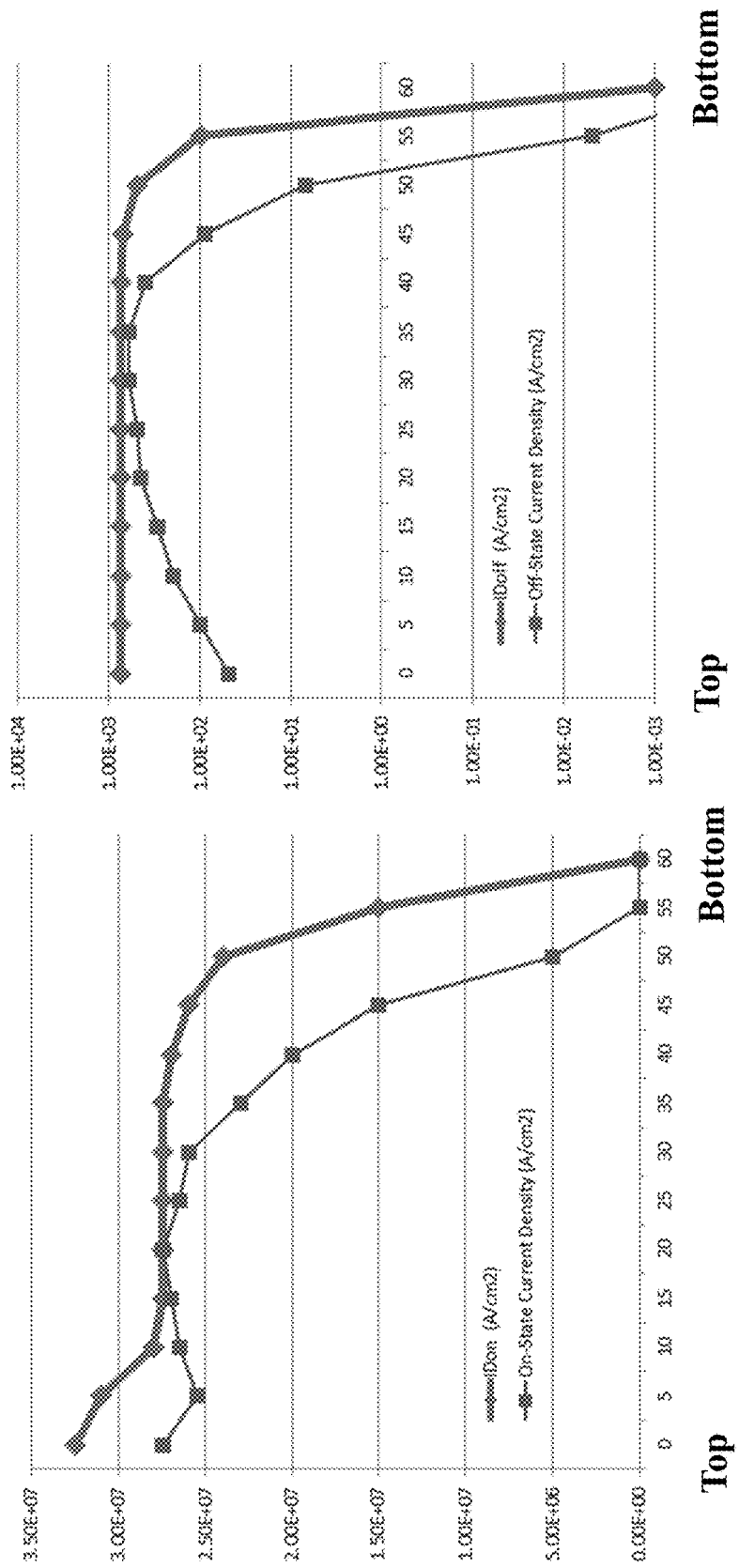
FIG. 9 illustrates uniform on-state and off-state current densities achieved by implementing a Ge concentration profile in the fin, according to aspects of the present disclosure.

FIG. 9 illustrates uniform on-state and off-state current densities achieved by implementing the Ge concentration profile in the fin, according to aspects of the present disclosure. Without implementation of the Ge concentration profile shown in FIG. 8 in the fine 120, the on-state current density curves and the off-state current density curves of the fin 120 suffer from low current density values in the top and bottom portions of the fin. The low current densities indicate higher threshold voltages. If the Ge concentration profile shown in FIG. 8 is implemented to the fin 120 in FIG. 1, the on-state current density curve, denoted as $I_{Don}$, and off-state current density curve, denoted as $I_{Doff}$, will be substantially uniform, as shown in FIG. 9. The uniform on-state and off-state current densities indicate a uniform threshold voltage distribution along the height of the fin 120.

Figure 10:
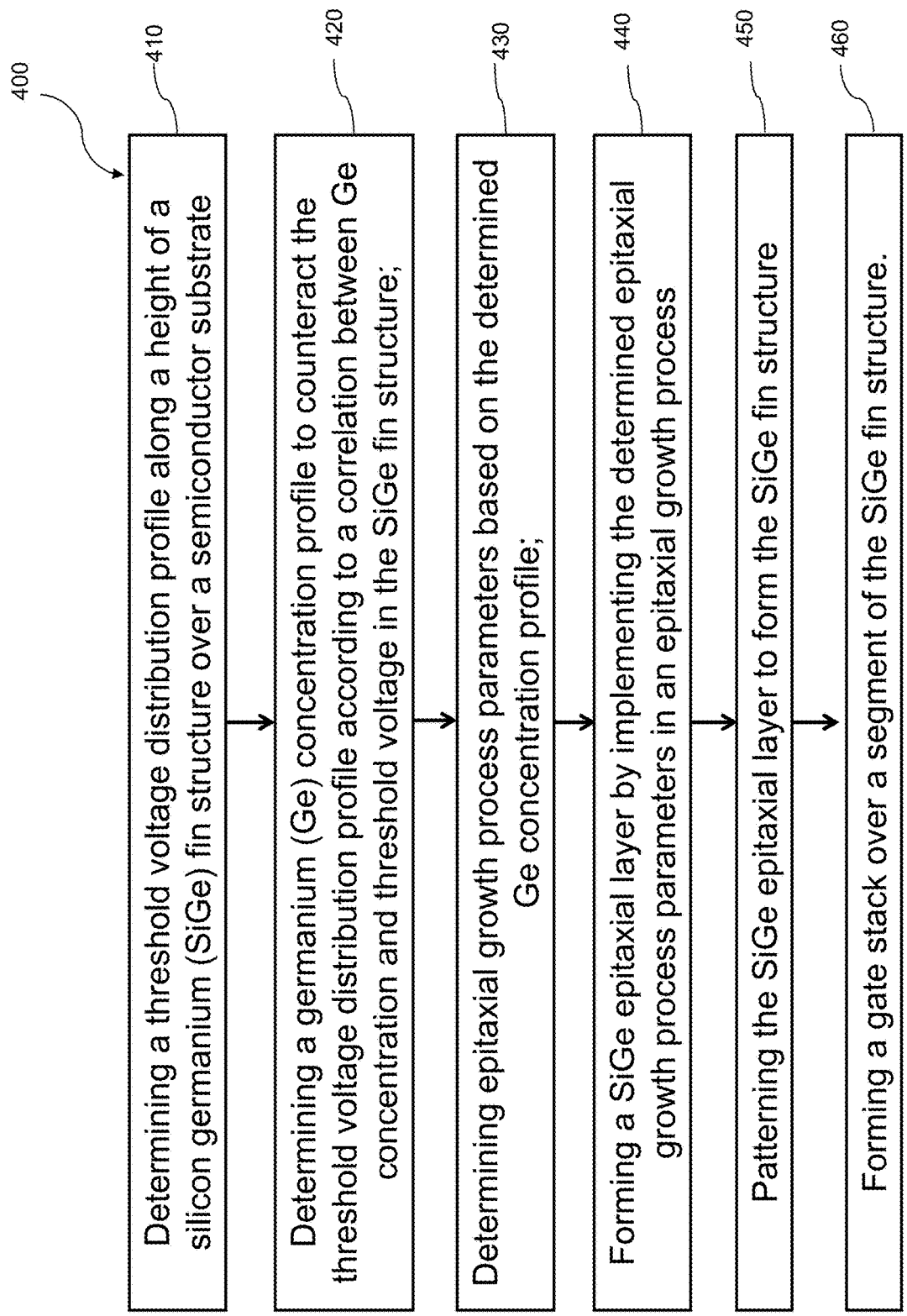
FIG. 10 is a flowchart illustrating a method of forming a SiGe fin structure, according to aspects of the present disclosure.

FIG. 10 is a flowchart illustrating a method 400 of forming a SiGe fin structure, according to aspects of the present disclosure. The method 400 includes a step 410 of: determining a threshold voltage distribution profile along a height of a silicon germanium (SiGe) fin structure over a semiconductor substrate; a step 420 of: determining a germanium (Ge) concentration profile to counteract the threshold voltage distribution profile according to a correlation between Ge concentration and threshold voltage in the SiGe fin structure; a step of 430 of: determining epitaxial growth process parameters based on the determined Ge concentration profile; a step of 440 of: forming a SiGe epitaxial layer by implementing the determined epitaxial growth process parameters in an epitaxial growth process; a step 450 of: etching the SiGe epitaxial layer to form the SiGe fin structure; and a step 460 of: forming a gate stack over a segment of the SiGe fin structure.

For ease of reference, each of the steps in method 400 will be described with respect to the SiG fin 120. In step 410, a threshold voltage distribution profile along a height of the SiGe fin 120 is determined. In some embodiments, the step 410 can be carried out using one or more of methods 3101, 3012 and 3103. Then, in step 420, a Ge concentration profile to counteract the threshold voltage distribution profile in step 410 is determined according to a correlation between Ge concentration and threshold voltage in the SiGe fin 120. In some embodiments, such a correlation is 4 mV threshold voltage lowering per 1% increase in Ge concentration. In some embodiments, such a correlation is that the threshold voltage would decrease with the increase in Ge concentration in general. In some embodiments, Ge concentration increase between 5% and 15% can be implemented to modulate the threshold voltage in the SiGe fin. Given the correlation set forth above, the Ge concentration increase range of between 5% and 15% corresponds to 20 mV to 60 mV of downward adjustment of threshold voltages.

In some embodiments, the SiGe layer, out of which the fin 120 is formed, is formed by delivery of Si and Ge-containing gas reactants in a CVD or LPCVD epitaxial growth process. Common Ge-containing gas reactants include, but not limited to, germanium tetrahydride ($GeH_4$) and germanium hydride ($Ge_2H_6$). Common Si-containing gas reactants include, but not limited to, silane ($SiH_4$), disilane ($Si_2H_6$) and trisilane ($Si_3H_8$). In some embodiment, in order to achieve desired Ge concentration profile in the fin 120, many epitaxial growth process parameters have to be determined and selected. For example, the parameters may include chamber pressure, partial pressures of the reactant gases, and chamber temperature. At step 430, epitaxial growth process parameters are determined based the on Ge concentration profile determined in step 420.

In step 440, the epitaxial growth process parameters determined in step 430 are implemented in the epitaxial growth process used to form the SiGe epitaxial layer. Such a SiGe epitaxial layer will have a Ge concentration profile at least substantially similar to if not the same as the Ge concentration profile determined in in step 420. Step 440 is followed by step 450, where the SiGe epitaxial layer is patterned by lithography technique and etching to form fin structures such as the fin 120. Fin structures so formed share the Ge concentration profile of the SiGe epitaxial layer.

Finally, in step 460, a gate stack is formed over the SiGe fin. It is understood that the fin 120 may undergo further CMOS processes to form various features such as contacts/vias, interconnect metal layers, dielectric layers, passivation layers, etc.

In some instance, the fin structures can be formed from silicon carbon (SiC) or silicon germanium carbon (SiGeC) epitaxial layer. As compared to Ge, which introduces localized tensile strain in Si-containing epitaxial layers, carbon introduces localized compressive strain in Si-containing epitaxial layers. Consequently, carbon not only can be used to strain the Si lattice in epitaxial layers but also can be used to modulate the tensile strain introduced by germanium or reduce lattice defect in the epitaxial layer. Similar to Ge, the concentration of carbon in the SiC or SiGeC epitaxial layers can be controlled by the epitaxial growth process parameters, such as delivery of C-containing gas reactants into the process chamber. In some instances, C-containing gas reactants may include as methane ($CH_4$), ethane ($C_2H_6$) and propane ($C_3H_8$).

Thus, the present disclosure provides a method of forming a semiconductor device structure in accordance with some embodiments. The method includes determining a threshold voltage distribution profile along a height of a silicon germanium (SiGe) fin structure over a semiconductor substrate; determining a germanium (Ge) concentration profile to counteract the threshold voltage distribution profile according to a correlation between Ge concentration and threshold voltage in the SiGe fin structure; forming a SiGe epitaxial layer, the SiGe epitaxial layer including the Ge concentration profile; etching the SiGe epitaxial layer to form the SiGe fin structure; and forming a gate stack over a segment of the SiGe fin structure.

The present disclosure provides a method of forming over a semiconductor substrate a silicon germanium (SiGe) fin structure having a uniform threshold voltage distribution along a height of the SiGe fin structure. The method includes: determining a threshold voltage distribution along the height of the SiGe fin structure, wherein the threshold voltage distribution is a function of at least effect of a trigate, a fin width distribution along the height of the SiGe fin structure, proximity to source/drain features, level of dopants in the source/drain features, and a concentration profile of a dopant along the height of the SiGe fin structure; generating the Ge concentration profile according to the threshold voltage distribution based on a correlation between Ge concentrations and threshold voltages in the SiGe fin structure; forming a SiGe epitaxial layer, the SiGe epitaxial layer comprising the Ge concentration profile; and etching the SiGe epitaxial layer to form the SiGe fin structure.

In addition, the present disclosure provides a method of forming a semiconductor device structure. The method includes providing a semiconductor substrate; over the semiconductor substrate, forming a silicon-germanium (SiGe) fin structure having a bottom portion, a middle portion, and a top portion, and forming a gate stack over a channel region of the SiGe fin structure. Forming the SiGe fin structure includes forming the bottom portion of the SiGe fin structure with a first average Ge concentration, forming the middle portion of the SiGe fin structure with a second average Ge concentration, and forming the top portion of the SiGe fin structure with a third average Ge concentration, wherein the second average Ge concentration is lower than the first and third average Ge concentrations.

Still, the present disclosure provides a semiconductor device structure in accordance with some embodiments. The semiconductor device structure includes a semiconductor substrate; a silicon-germanium (SiGe) fin structure over the semiconductor substrate, wherein the SiGe fin structure comprises a germanium (Ge) concentration profile over a height of the SiGe fin structure away from the semiconductor substrate; wherein the SiGe fin structure includes a bottom portion, a middle portion on top of the bottom portion, and a top portion on top of the middle portion; and a gate stack formed over a segment of the SiGe fin structure, wherein the Ge concentration profile comprises a first average Ge concentration in the top portion of the SiGe fin structure, a second average Ge concentration in the middle portion of the SiGe fin structure, and a third average Ge concentration in the bottom portion of the SiGe fin structure, the second average Ge concentration being lower than the first and third average Ge concentrations.

While the present disclosure has been described by way of example and in terms of the preferred embodiments, it is to be understood that the present disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a semiconductor device structure, comprising:
    determining a threshold voltage distribution profile along a height of a silicon germanium (SiGe) fin structure over a semiconductor substrate;
    determining a germanium (Ge) concentration profile to counteract the threshold voltage distribution profile according to a correlation between Ge concentration and threshold voltage in the SiGe fin structure;
    forming a SiGe epitaxial layer with the Ge concentration profile along a thickness of the SiGe epitaxial layer;
    etching the SiGe epitaxial layer to form the SiGe fin structure; and
    forming, on the SiGe fin structure, a field-effect transistor having a uniform threshold voltage along the height of the SiGe fin structure.

2. The method of claim 1, wherein determining the Ge concentration profile along the height of the SiGe fin structure comprises:
    obtaining a design of a semiconductor device containing the SiGe fin structure; and
    deriving the threshold voltage distribution along the height of the SiGe fin structure based on computer simulations of the design.

3. The method of claim 1, wherein the correlation is that the threshold voltage lowers as the Ge concentration increases in the SiGe fin structure.

4. The method of claim 1, wherein the correlation is for every one percent (1%) increase in Ge concentration in the SiGe fin structure, the threshold voltage is lowered by approximately 4 mV.

5. The method of claim 1, wherein determining the Ge concentration profile along the height of the SiGe fin structure comprises:
    forming a semiconductor device comprising the SiGe fin structure; and
    measuring the threshold voltage distribution along the height of the SiGe fin structure.

6. The method of claim 1, where determining the Ge concentration profile along the height of the SiGe fin structure comprises:
    obtaining a design of a semiconductor device containing the SiGe fin structure; and
    deriving a theoretical threshold voltage distribution along the height of the SiGe fin structure based on computer simulations of the design;
    forming a semiconductor device according to the design, wherein the semiconductor device includes the SiGe fin structure;
    measuring parameters of the SiGe fin structure in the semiconductor device; and
    obtaining the threshold voltage distribution by making corrections to the theoretical threshold voltage distribution based on the measured parameters.

7. A method of forming over a semiconductor substrate a silicon germanium (SiGe) fin structure having a uniform threshold voltage distribution along a height of the SiGe fin structure, the method comprising:
    determining a threshold voltage distribution along the height of the SiGe fin structure, wherein the threshold voltage distribution is a function of at least effect of a trigate, a fin width distribution along the height of the SiGe fin structure, proximity to source/drain features, level of dopants in the source/drain features, and a concentration profile of a dopant along the height of the SiGe fin structure;
    generating a Ge concentration profile according to the threshold voltage distribution based on a correlation between Ge concentrations and threshold voltages in the SiGe fin structure, wherein the Ge concentration profile is not uniform;
    forming a SiGe epitaxial layer, the SiGe epitaxial layer having the Ge concentration profile along a thickness of the SiGe epitaxial layer; and etching the SiGe epitaxial layer to form the SiGe fin structure having the uniform threshold voltage distribution along the height of the SiGe fin structure.

8. The method of claim 7, wherein determining the threshold voltage distribution along the height of the SiGe fin structure comprises:
obtaining a design of a semiconductor device containing the SiGe fin structure; and
deriving the threshold voltage distribution along the height of the SiGe fin structure based on computer simulations of the design.

9. The method of claim 7, wherein the correlation is that the threshold voltage lowers as the Ge concentration increases in the SiGe fin structure.

10. The method of claim 7, wherein the correlation is for every one percent (1%) increase in Ge concentration, the threshold voltage is lowered by approximately 4 mV.

11. The method of claim 7, wherein determining the threshold voltage distribution along the height of the SiGe fin structure comprises:
forming a semiconductor device including the SiGe fin structure;
measuring parameters of the SiGe fin structure in the formed semiconductor device; and
obtaining the threshold voltage distribution along the height of the SiGe fin structure based on computer simulations of a design of the semiconductor device with the measured parameters.

12. The method of claim 11, wherein the measuring of the parameters includes measuring dopant levels in source and drain features of the semiconductor device, and strain in a shallow trench isolation region around the SiGe fin structure.

13. The method of claim 7, wherein a difference between a highest Ge concentration and a lowest Ge concentration in the Ge concentration profile falls within a range between 5% and 15%.

14. A method of forming a semiconductor device structure, comprising:
providing a semiconductor substrate;
over the semiconductor substrate, forming a silicon-germanium (SiGe) fin structure having a bottom portion, a middle portion, and a top portion, including:
forming the bottom portion of the SiGe fin structure with a first average Ge concentration,
forming the middle portion of the SiGe fin structure with a second average Ge concentration, and
forming the top portion of the SiGe fin structure with a third average Ge concentration, wherein the second average Ge concentration is lower than the first and third average Ge concentrations; and
forming a gate stack over a channel region of the SiGe fin structure.

15. The method of claim 14, wherein the bottom portion comprises a bottom fin width larger than both a top fin width of the top portion of the SiGe fin structure and a middle fin width of the middle portion of the SiGe fin structure.

16. The method of claim 14, wherein the gate stack comprises a trigate around the top portion of the SiGe fin structure where the gate stack is formed over a top surface and side surfaces of the channel region of the SiGe fin structure.

17. The method of claim 14, wherein the third average Ge concentration is lower than the first average Ge concentration.

18. The method of claim 14, further comprising:
forming a base portion of the SiGe fin structure in the semiconductor substrate directly below the bottom portion, wherein the base portion is formed with a fourth average Ge concentration, the fourth average Ge concentration being lower than the second average Ge concentration.

19. The method of claim 14, wherein the first average Ge concentration is higher than the third average Ge concentration.

20. The method of claim 14, wherein a difference between the third average Ge concentration and the second average Ge concentration falls within a range between 5% and 15%.

* * * * *